United States Patent
Aton

Patent Number: 5,929,645
Date of Patent: Jul. 27, 1999

[54] INTEGRATED CIRCUIT TESTER USING ION BEAM

[75] Inventor: Thomas J. Aton, Dallas, Tex.

[73] Assignee: Texas Instruments Incorporated, Dallas, Tex.

[21] Appl. No.: 08/846,062

[22] Filed: Apr. 25, 1997

[51] Int. Cl.⁶ .......................... G01R 31/26; G01R 31/305
[52] U.S. Cl. ............................................. 324/751; 324/765
[58] Field of Search .................................. 324/501, 750, 324/751, 765, 158.1

[56] References Cited

U.S. PATENT DOCUMENTS

| | | | |
|---|---|---|---|
| 4,629,898 | 12/1986 | Orloff et al. ...................... | 324/158.1 X |
| 4,949,034 | 8/1990 | Imura et al. ............................... | 324/765 |
| 5,089,774 | 2/1992 | Nakano ..................................... | 324/751 |
| 5,376,883 | 12/1994 | Kaito ..................................... | 324/158.1 |
| 5,592,099 | 1/1997 | Kuribara et al. ......................... | 324/751 |
| 5,747,803 | 5/1998 | Doong ................................. | 324/751 X |
| 5,757,198 | 5/1998 | Shida et al. ............................... | 324/751 |
| 5,804,980 | 9/1998 | Nikawa .................................... | 324/752 |

Primary Examiner—Glenn W. Brown
Attorney, Agent, or Firm—Carlton H. Hoel; W. Richard Brady; Richard L. Donaldson

[57] ABSTRACT

Testing an Integrated circuit (420) for performance during exposure to an ion beam. Ion beams of atoms with atomic weights in the range of 6 to 20 impinging on an integrated circuit simulate the effects of cosmic ray neutrons interacting with silicon atoms of the integrated circuit.

5 Claims, 3 Drawing Sheets

INTEGRATED CIRCUIT TESTER USING ION BEAM

BACKGROUND AND SUMMARY OF THE INVENTION

The invention relates to semiconductor devices and circuits, and, more particularly, to both semiconductor testing.

Many digital semiconductor devices, such as DRAMs, SRAMs, A/D converters, and so forth rely on electrical charge on a capacitive node for storage of a digital signal, and thus such devices are sensitive to events which transport unintended charge to the node. For example, naturally occurring radioactive elements such as uranium and thorium appear in trace amounts in the packaging materials for integrated circuits; and these elements decay to release energetic alpha particles. The alpha particles penetrate the integrated circuit and create electron-hole pairs. Local electric fields, such as at pn junctions, can separate the electron-hole pairs and a net charge pulse is collected at a node. Such a charge pulse can change the state of the node and thereby cause a soft error.

Experimental testing of alpha particle effects can be simulated by directing a beam of alpha particles from an accelerator into an integrated circuit and checking upon performance. Such an experimental setup removes the top (decaps) of an integrated circuit package but does not attempt to remove any of the protective overcoat of the silicon die; the alpha particles have sufficient energy (1–5 MeV) to penetrate the patterned layers on the die and pass well into the silicon substrate. It is known to focus an alpha particle beam to provide detailed analysis of the alpha particle effects.

Cosmic rays provide another source of unintended charge effects: high energy (100+ MeV) protons and neutrons of varying energy can interact with silicon or other nuclei in the integrated circuit to produce energetic heavy recoil nuclei which generate electron-hole pairs. FIG. 1 shows the cosmic ray flux at sea level. O'Gorman, The Effect of Cosmic Rays on the Soft Error Rate of a DRAM at Ground Level, 41 IEEE Tr.Elec.Dev. 533 (1994) measures the soft error rate in a set of DRAM chips due to cosmic rays and concludes that the soft error rate correlates with the flux of 10–170 MeV neutrons. Also see Ziegler et al, The Effect of Sea Level Cosmic Rays on Electronic Devices, 52 J.Appl.Phys. 4305 (1981).

The infrequency of cosmic ray interactions together with the difficulty of creating high energy neutron beams makes testing for such effects a problem. Consequently, simulations have appeared; for example, Shrinivasan et al, Parameter-Free, Predictive Modeling of Single Event Upsets due to Protons, Neutrons, and Pions in Terrestrial Cosmic Rays, 41 IEEE Tr.Nuc.Sci. 2063 (1994) describes a design tool for assessment of cosmic ray soft errors in a chip design.

The present invention provides a method of testing integrated circuits for cosmic ray induced soft error sensitivity by use of a heavy ion beam impacting the integrated circuit to emulate recoil nuclei that would be created by cosmic rays interacting with silicon nuclei in the integrated circuit. Thus a large number of events can be easily generated and provide fine detail analysis. Further, the heavy ion beam can be focussed at particular spots on the integrated circuit to differentiate effects of various design choices. Also, the ion beam can be blanked so single ion events can be analyzed.

This testing method has the advantage of good emulation of neutron-silicon recoil interactions with a simple testing setup.

BRIEF DESCRIPTION OF THE DRAWINGS

The drawings are schematic for clarity.

DESCRIPTION OF THE PREFERRED EMBODIMENTS

Preferred Embodiment Testing Method

The interaction probability of a high energy neutron with a silicon nucleus (or possibly an oxygen nucleus) in the active region of a silicon-based integrated circuit is very small, but each recoil event has a large probability of causing a soft error. The recoiling, charged silicon nucleus then generates a large number of electron-hole pairs as it travels through the silicon lattice. If separated by the electric fields of a pn junction, the electrons and holes can produce memory errors. Some neutron-nuclear events also knock pieces from the silicon nucleus (spallation event) so the recoiling heavy-ion can be silicon or one of the elements immediately lighter than silicon (aluminum, magnesium, sodium, neon, fluorine, . . . ). The spallation events also may produce one or more light ions such as hydrogen (including protons) or helium (including alphas), but these are much less important because they generate much less charge per micrometer of travel. Because the recoil ions carry a large electric charge, they interact strongly with the electrons in the silicon lattice and stop in a short distance, delivering much of their energy to the silicon electrons and thereby generate an intense burst of electron-hole pairs.

Figure 1:
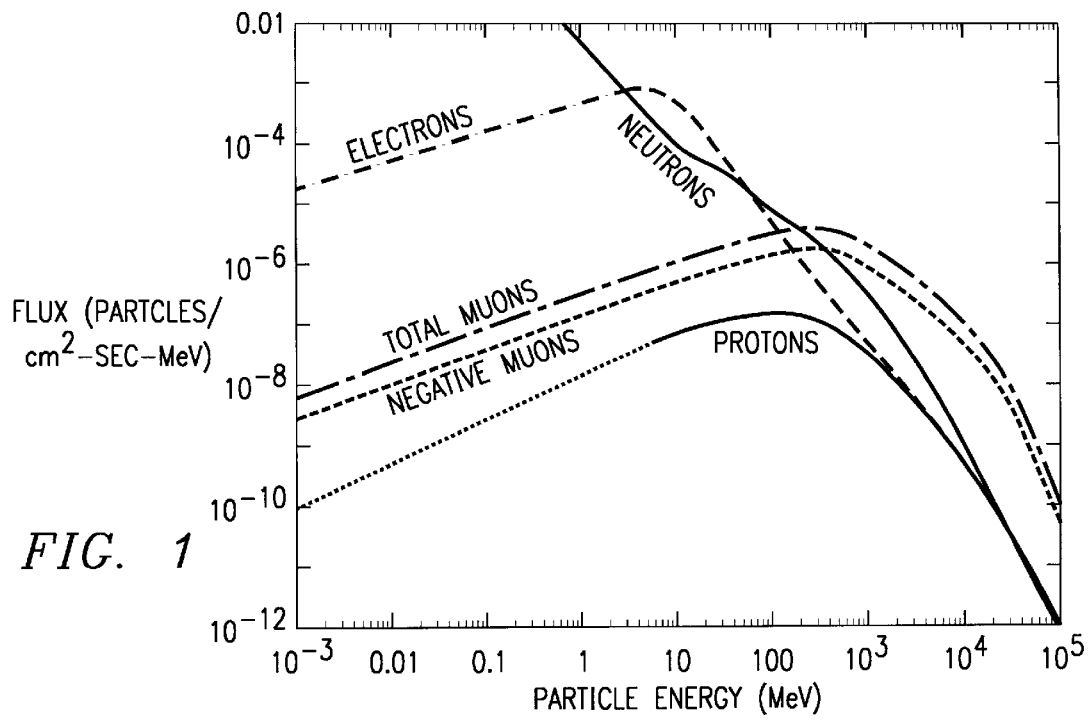
FIG. 1 shows cosmic ray flux.
Figure 2A:
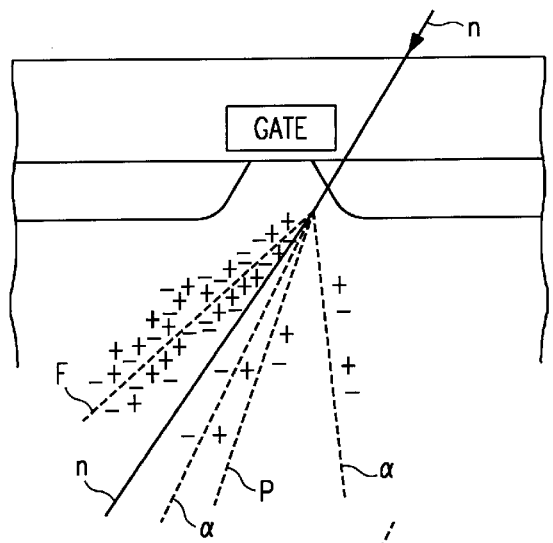
FIGS. 2–b illustrate a neutron-silicon interation with a recoil nucleus and the emulation by an incident fluorine ion.

A model for the neutron-silicon interaction presumes neutron enters a target silicon nucleus and suffers binary collisons with the protons and neutrons of the silicon nucleus. After these collisons, one or more neutrons or protons along with other fragments may emerge. Most importantly, the excited nucleus recoils from the impact and thus also moves through the silicon substate. The charged products (protons, alphas, and recoil nucleus) all create electron-hole pairs as they dissipate their energy in the silicon substrate. FIG. 2a heuristically illustrates a MOS transistor with a cosmic ray neutron (labelled n in the upper righthand portion) penetrating the channel region and interacting with a silicon nucleus to produce two alpha particles (labeled α), a proton (labeled p), a neutron (labeled n in lower lefthand portion), and a fluorine nucleus (labeled F). The heuristic reaction is

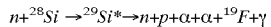

$$n + {}^{28}Si \rightarrow {}^{29}Si^* \rightarrow n+p+\alpha+\alpha+{}^{19}F+\gamma$$

In the case of a very high energy incoming neutron, a forward scattered outgoing neutron (or proton) will retain the majority of the energy. Of course, with a larger recoil nucleus, such as Si or Al, there would be no alphas, and with recoil nuclei such as Mg or Na, there could be at most one alpha.

Figure 2B:
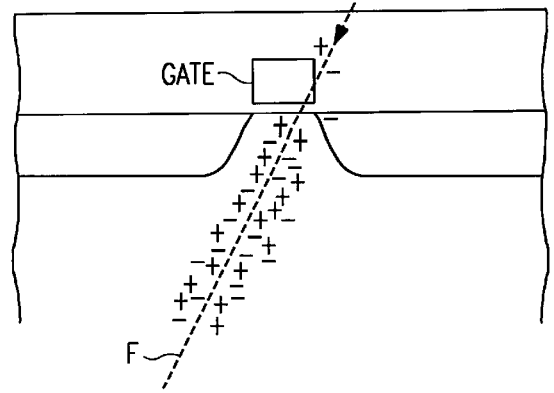

FIG. 2b heuristically shows emulation of the recoil F nucleus and its electron-pair production in the MOS transistor by an F nucleus directed into the MOS transistor. In fact, the following paragraphs illustrate how incoming F nuclei can emulate the electron-hole pair production of all of the heavy recoil nuclei that arise from interactions of cosmic ray neutrons (or protons or pions) with silicon nuclei in an integrated circuit. And the preferred embodiments recognize and exploit such emulation.

Figure 3A:
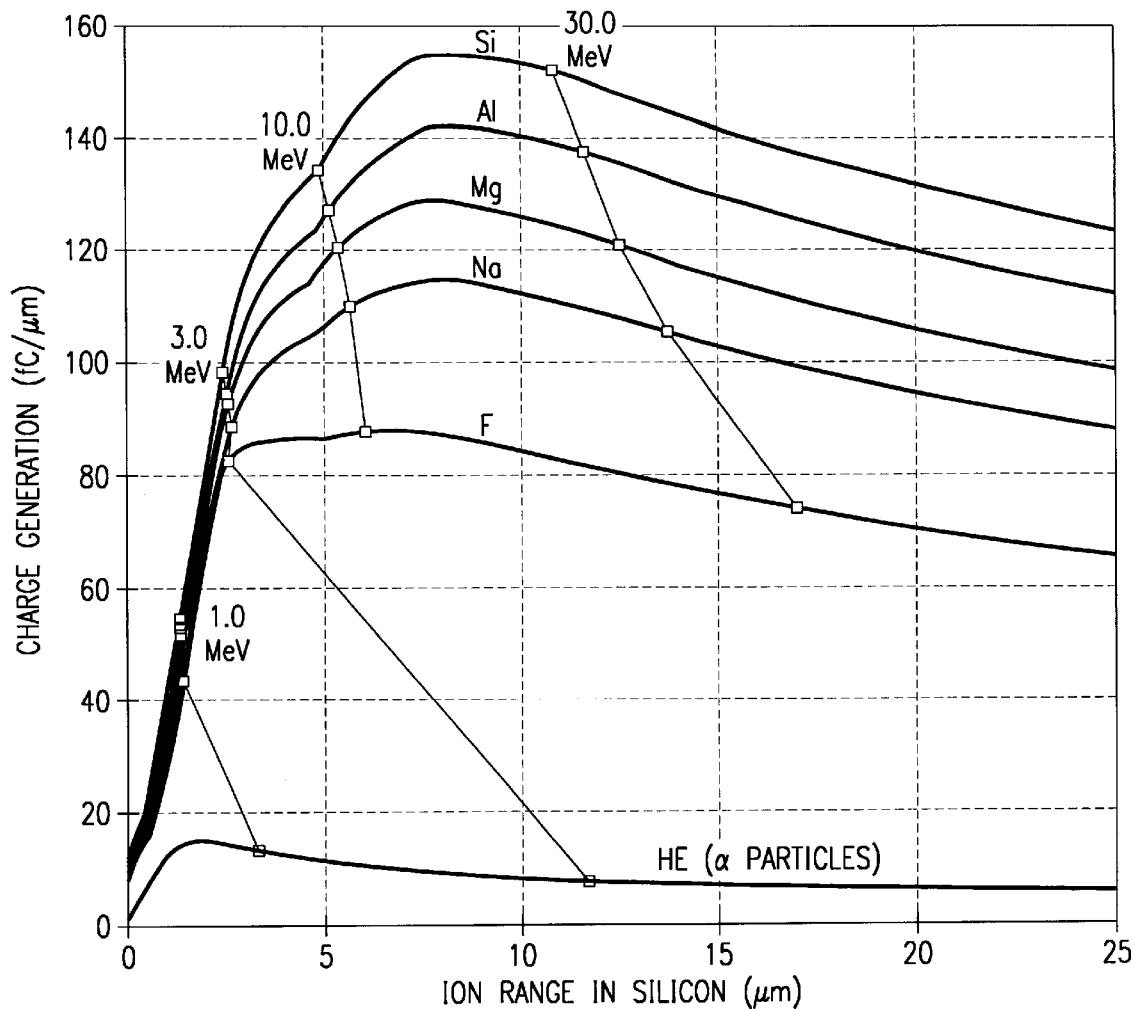
FIGS. 3–b show charge generation by various ions in silicon.
Figure 3B:
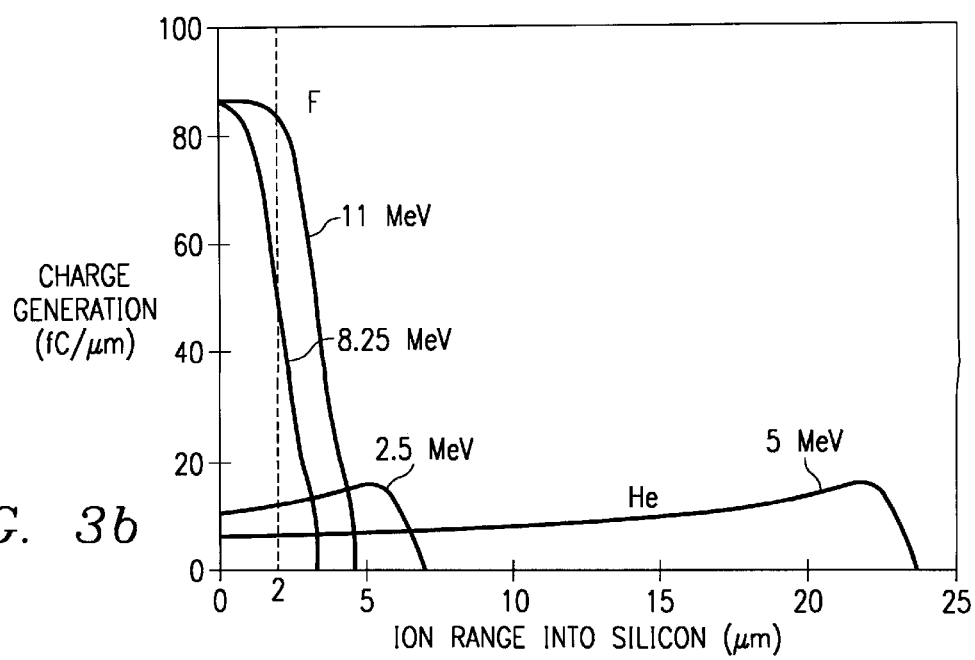

The important parameters for the recoiling nuclei are its energy, its range, and its rate of electron-hole pair creation. FIG. 3a shows a comparison of the parameters predicted for silicon and other slightly-less-charged nuclei that can be produced in neutron-silicon recoil and spallation events. When created, an energetic heavy ion moves along its curve (toward zero energy and range) losing energy to electron-hole pair creation at the rates shown in FIG. 3a. The area under a curve gives the total charge generated. The starting points (ion travel is right to left in FIG. 3a) corresponding to a few relevant energies are also marked on the ion curves. The bottom curve of FIG. 3a shows the charge generation for alpha particles; and FIG. 3b shows the charge generated along the path for two different energy F ions and two different energy alphas. The extremely short stopping distance and intense charge bursts associated with the heavy ions imply heavy ions can upset memories with much larger critical charges than can alpha particles. In effect, an alpha particle with the same energy as a heavy ion will create electron-hole pairs at a lower density over a longer path. On any given pn junction much less of the charge created by the alpha will be collected.

FIG. 3a shows the charge generation density for a recoiling silicon nucleus peaks at about 150 fC/$\mu$m at a depth of about 8 $\mu$m and this compares to a peak of 90 fC/$\mu$m for fluorine at a depth of 7 $\mu$m. The ions between silicon and fluorine (neon, sodium, magnesium and aluminum) have charge generation lying between that of silicon and that of fluorine. Ions of elements such as oxygen, nitrogen, and carbon will have charge generation less than that of fluorine but well above that of alphas, and these ions are possible ions for use in the preferred embodiments. Similarly, ions of elements heavier than silicon will have some what greater charge generation densities, and could be used; for example, phosphorus, sulfur, chlorine, argon, potassium, and calcium. Further, FIG. 3a indicates for an ion energy of about 3 MeV, all of these heavy ions have a range of about 3 $\mu$m and generate about 150 fC. Consequently, the use of fluorine ions (or any of these other heavy ions) in charge generation testing can substitute for the charge generation of all of the heavy ions created in neutron-silicon interactions.

Figure 4:
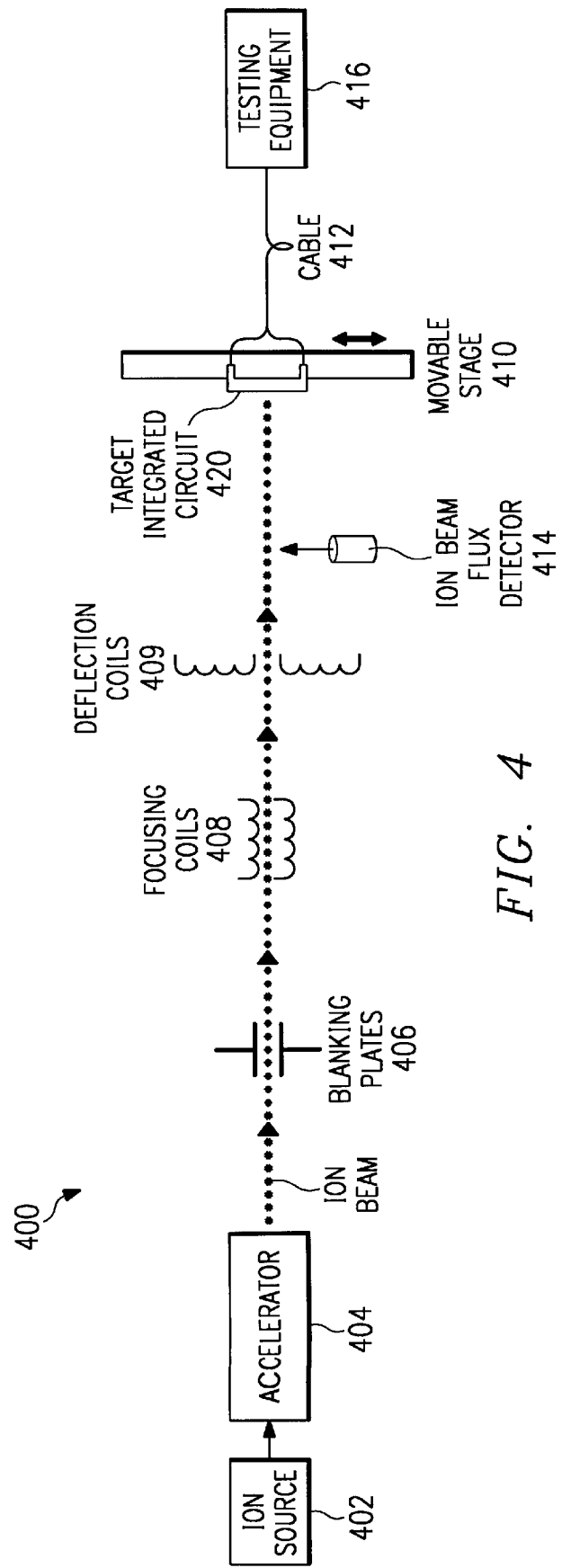
FIG. 4 shows in block format a preferred embodiment testing setup.

FIG. 4 shows in block format a preferred embodiment testing apparatus 400 as including fluorine ion source 402, accelerator 404, blanking plates 406, focussing coils 408, deflecting coils 409, movable stage 410 which has a socket for a packaged integrated ciruit plus connecting wiring cable 412 to integrated circuit testing equipment 416, and ion beam flux measuring device 414. Target integrated circuit 420 is shown mounted on stage 410. Target 420 can be in a ceramic package with the lid removed or in a plastic encapsulation package which has been decapped or in any other form which can be connected to integrated circuit testing equipment 416. Ion source 402 could instead generate Si, Al, Mg, . . . ions, but F ions are convenient and can be multiply ionized (e.g., $F^{++++}$) which allows for higher energy in a electrostatic accelerator. Accelerator 404 may be a tandem van de Graaf accelerator. The beam spot may be produced by focussing or by masking the beam with, for example, a tantalum mask. A small beam spot (~1 $\mu$m) is desirable for precisely locating the beam in experimental testing. Typical accelerators can provide beam currents of up to $10^5$ ions/$\mu m^2$sec and energies up to 15 MeV for F. If masking apertures are used, they can also be the interface between the vacuum of the accelerator and the atmospheric ambient of target integrated circuit 420. The blanking plates 406 can chop the beam with resolution of less than 1 microsecond; this allows for isolation of single upset events and thus detailed analysis. Focussing coils 408 can adjust the spot size, and deflecting coils 409 can scan the beam on the target. Also, stage 410 moves target 420 through the ion beam with resolution of 0.1 $\mu$m; target 420 can either be scanned by the beam or a fixed location can be investigated. Target integrated circuit 420 operates under control of testing equipment 416, and blanking plates 406 and stage 410 can be synchronized with the testing equipment; thus individual transistors or pn junctions in the integrated circuit can be subject to thousands of bursts and thereby accurately analyzed. Ion beam flux measuring device 414 may be a fast diode which can be inserted into the ion beam and, after flux mesurement, withdrawn.

The energy of the ions in the ion beam penetrating the target integrated circuit is chosen so that after the ions penetrate the wiring and insulation layers overlying the silicon substrate, the ions will have energy comparable to that of recoil nuclei and thereby create the desired size of charge bursts. Indeed, the critical burst size can be estimated for a transistor, memory cell, or other device, and testing apparatus 400 would be used to vary the burst size and its location to determine accurately the soft error sensitivity of the target integrated circuit design parameters.

If very heavy ions, such as iron or gold, were used in the accelerator beam, then the charge generation density would be much higher (more than twice that of silicon ions) and the charge bursts would not very accurately emulate those of the expected recoil nuclei generated by cosmic ray neutron interactions with silicon. Also, the stopping distance for very heavy ions is much less than that of silicon, so the wiring and insulation overlying an integrated circuit makes control of the ion energy upon entering the silicon substrate difficult.

Modifications and Advantages

The preferred embodiments may be varied in many ways while retaining one or more of the features of the use of a beam of nuclei characteristic of cosmic ray neutron-silicon interactions to emulate soft error events in an integrated circuit under test.

For example, the deflecting coils could be used to move the beam location on the target integrated circuit under test either separately from or in conjunction with the stage that moves the target. A system that detects electrons, ions, or photons created by the passage of the beam particles could be substituted for the direct counting to determine the beam flux. The device under test and stage and deflection coils could be in or out of a vacuum system common to the accelerator. All of the stage, device testing equipment, focussing, blanking, and other components could be under the control of a master computer. Measurements on the device could be synchronized with known arrival time of the ions to exclude noise generated at other times. The ion beam may be bent by one or more magnets to insure that only a single isotopic species of ions reach the target.

What is claimed is:

1. A method of testing integrated circuits, comprising the steps of:
   (a) directing a beam of ions at an integrated circuit, said ions comprision an element having an atomic numbers in the range of 6 to 20; and
   (b) measuring performance of said integrated circuit.

2. The method of claim 1, comprising the further step of:
   (a) chopping said beam of ions, whereby the beam of ions impacts said integrated circuit only during separated intervals of time.

3. The method of claim 2, wherein:
   (a) during one of said intervals of time the number of ions impacting said integrated circuit is less than 3.

4. An integrated circuit soft error test apparatus, comprising:
   (a) an ion beam source, said source providing a beam of ions comprising an element having an atomic number in the range of 6 to 20;

(b) an integrated circuit support with connectors for connection to an integrated circuit, said support in a path of said beam of ions; and (c) integrated circuit testing equipment coupled to said connectors.

5. The soft error test apparatus of claim 4, further comprising:

(a) a beam chopper in a path of said beam of ions.

* * * * *

UNITED STATES PATENT AND TRADEMARK OFFICE
CERTIFICATE OF CORRECTION

PATENT NO.     : 5,929,645
DATED          : July 27, 1999
INVENTOR(S)    : Thomas J. Aton It is certified that error appears in the above-identified patent and that said Letters Patent is hereby corrected as shown below:

Title page,
Insert Item -- [60] Related U.S. Application Data Provisional Application No. 60/016,156 filed 04/26/1996. --

Signed and Sealed this

Twenty-seventh Day of May, 2003

JAMES E. ROGAN
*Director of the United States Patent and Trademark Office*